United States Patent
Mueller

[11] Patent Number: 5,956,234
[45] Date of Patent: Sep. 21, 1999

[54] METHOD AND STRUCTURE FOR A SURFACE MOUNTABLE RIGID-FLEX PRINTED CIRCUIT BOARD

[75] Inventor: Gerhard M. Mueller, Pleasanton, Calif.

[73] Assignee: Integrated Device Technology, Inc., Santa Clara, Calif.

[21] Appl. No.: 09/009,650

[22] Filed: Jan. 20, 1998

[51] Int. Cl.⁶ .................................................. H05K 1/11
[52] U.S. Cl. ...................... 361/767; 361/749; 361/751; 361/803
[58] Field of Search ................................. 361/749–751, 361/789, 767, 768, 783, 803; 174/254, 268; 439/67

[56] References Cited

U.S. PATENT DOCUMENTS

| | | | |
|---|---|---|---|
| 4,956,694 | 9/1990 | Eide | 257/686 |
| 5,161,009 | 11/1992 | Tanoi et al. | 349/150 |
| 5,224,023 | 6/1993 | Smith et al. | 174/254 |
| 5,280,193 | 1/1994 | Lin et al. | 257/723 |
| 5,295,838 | 3/1994 | Walen et al. | 439/67 |
| 5,309,326 | 5/1994 | Minoru | 361/790 |
| 5,311,402 | 5/1994 | Kobayashi et al. | 361/760 |
| 5,313,096 | 5/1994 | Eide | 257/686 |
| 5,386,341 | 1/1995 | Olson et al. | 361/749 |
| 5,428,190 | 6/1995 | Stopperan | 174/254 |
| 5,448,511 | 9/1995 | Paurus et al. | 257/686 |
| 5,459,287 | 10/1995 | Swamy | 174/266 |
| 5,490,324 | 2/1996 | Newman | 29/830 |
| 5,717,556 | 2/1998 | Yanagida | 361/803 |
| 5,822,191 | 10/1998 | Tagusa et al. | 361/751 |

OTHER PUBLICATIONS

Gilleo, "A Simplified Version of the Multilayer Circuit Process", Electronic Packaging & Production, Feb. 1989 (4 pages).

Markstein, "Rigid–Flex: a Maturing Technology", Electronic Packaging & Production, Feb. 1996 (7 pages).

Advertorial, "New Test Demands for Chip–to–Chip Interconnect", Electronic Packaging & Production (1 page).

*Primary Examiner*—Leo P. Picard
*Assistant Examiner*—John B. Vigushin
*Attorney, Agent, or Firm*—Skjerven, Morrill, MacPherson, Franklin & Friel

[57] ABSTRACT

A method and structure for a surface mountable rigid-flex printed circuit board is disclosed. A rigid-flex circuit board is mounted onto a printed circuit board using standard surface mount technology such as ball grid array, pin grid array or solder screen print.

The use of rigid-flex board allows tested, burned in components to be used while still allowing a small multiple chip module footprint.

15 Claims, 6 Drawing Sheets

METHOD AND STRUCTURE FOR A SURFACE MOUNTABLE RIGID-FLEX PRINTED CIRCUIT BOARD

FIELD OF THE INVENTION

This invention applies to semiconductor packaging and mounting.

BACKGROUND OF THE INVENTION

An important aspect of modern electronics packaging is increasing the component density. A compact packaging technology is needed when mounting area is limited, dictating that circuit elements be closely spaced. Modules containing a number of semiconductor devices are used to densely place semiconductor devices and to obtain a small-sized electronic device.

In multiple chip modules die may be supplied as either bare untested, unburned-in die or supplied at greater expense as tested, burned in die. If one of the die fails in a multiple chip module using bare die, the entire module may be lost because the replacement procedure may not be cost effective or easy to effect. Hence, it is desirable to use tested, burned-in die. However, using tested burned-in die still does not guarantee that a die in the module will not fail and cause the entire module to be rejected. Therefore, prior art methods for fabricating multiple chip modules are relatively costly.

As an alternative to multiple chip modules, rigid-flex board has been used to achieve the form factor of a DRAM SIMM at double density. FIG. 1 shows how a rigid-flex board is mounted in the prior art. Parallel facing panels 10A and 10B are conductively and physically connected to each other at their respective upper ends by conductive trace containing tape 12. Together, panels 10A and 10B make up rigid-flex board 10. DRAM SIMM connector 15 is attached to the bottom edge of panel 10B and conductively and physically connects rigid-flex board 10 to a receptacle (not shown) on printed circuit board 18. Rigid-flex board 10 is used to allow surface mounting of components on four surfaces: 1) the exterior of panel 10A; 2) the exterior of panel 10B; 3) half of the interior of panel 10A; and 4) the half of the interior of panel 10B opposite the unoccupied half of the interior of panel 10A. This utilizes the area of three out of four panel surfaces while retaining a DRAM SIMM profile. The components mounted on rigid-flex board 10 may be burned in and tested prior to mounting to ensure operability.

In general, flexible rigid-flex printed circuit boards can be configured into three-dimensional multiplanar shapes to provide a high density and volume-efficient form of circuitry.

SUMMARY OF THE INVENTION

In accordance with this invention, a semiconductor packaging structure that uses packaged components is attached onto a substrate surface with standard surface mount technology (for example, solder screen print or ball grid array). Surface mount technology involves electrically and mechanically connecting components to the surface of a conductive pattern (such as on a printed circuit board) without using through holes. A rigid-flex printed circuit board is used as a substrate and converted into a surface mount module, using for example, a ball grid array footprint on one surface of the rigid-flex printed circuit board to provide a package that is surface mountable and has the same density advantages as using bare die in multiple chip modules. The end product is testable and reworkable with standard surface mount rework processes whereas bare die in multiple chip modules in most cases are not reworkable as the bare die are permanently sealed in the multiple chip modules.

In a standard ball grid array, the substrate upon which the die (typically silicon whose thermal coefficient differs from the thermal coefficient of the substrate) is mounted is thin, with a thickness selected to be within a desired range, for example between approximately 15–18 mils in some ball grid arrays. In contrast, use of surface mount technology with a rigid-flex board requires that the substrate be thicker than in the prior art ball grid array so as to support the packaged semiconductor devices mounted thereon. While the use of a thicker substrate in the rigid-flex board than in the multiple chip module results in a heavier package, a thicker substrate in the rigid-flex board allows the use of more standard technology to mount the packages on the rigid-flex board which lowers tooling requirements and costs.

Applications of the present invention include allowing economical, space efficient mounting of components in cellular telephones and other portable electronic devices where space is a premium.

DETAILED DESCRIPTION OF THE INVENTION

In accordance with this invention, surface mount technology and rigid-flex technology are combined to obtain a semiconductor packaging structure using surface mount technology. This invention allows, for example, a rigid-flex board to be used as a surface mount module.

Figure 1:
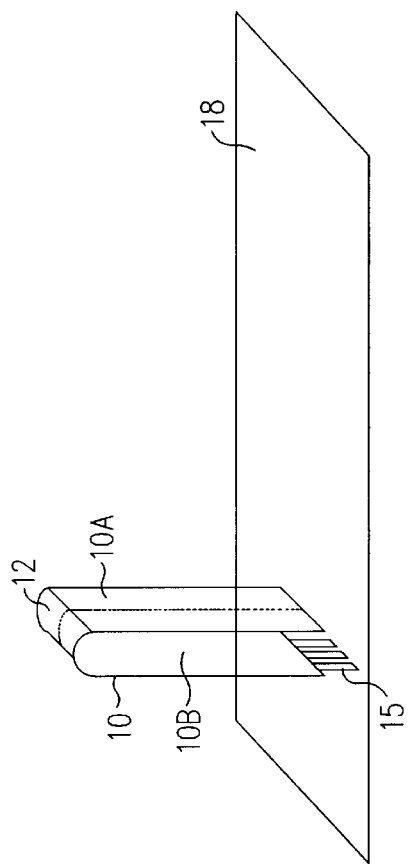
FIG. 1 shows prior art mounting of a rigid-flex board on a printed circuit board.
Figure 2:
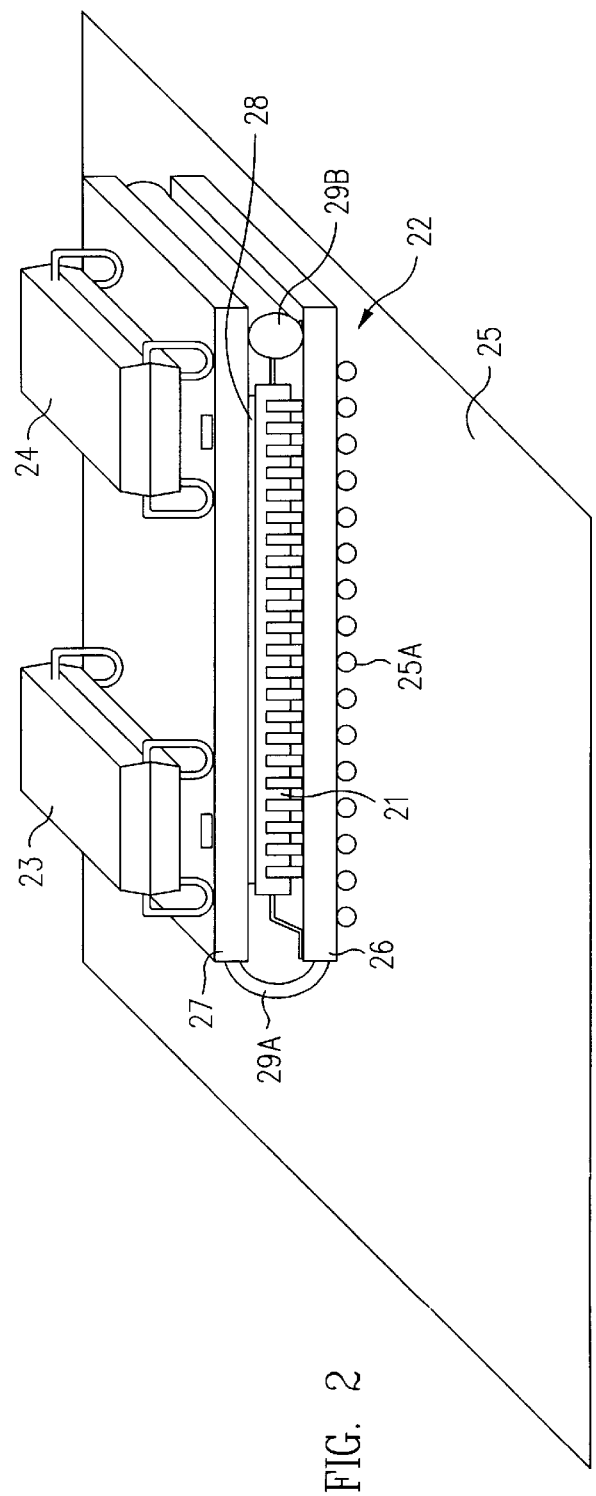
FIG. 2 shows an embodiment in accordance with this invention of mounting a rigid-flex board on a printed circuit with surface mount technology.

One embodiment in accordance with this invention is shown in FIG. 2. Rigid-flex board 22 is shown rotated sideways from the orientation of rigid-flex board 10 in FIG. 1. Top panel 27 (made in one embodiment of FR-4, fire-retardant epoxy resin-glass cloth laminate) and bottom panel 26 (also made in one embodiment of FR-4) positioned parallel to one another make up rigid-flex board 22. Panels 26 and 27 (square in one embodiment, but generally of any desired shape) are electrically connected to each other at one edge by conductive-trace-containing tape 29A, such as, for example, Flexcircuit tape. Top panel 27 is folded over bottom panel 26 in a sandwich configuration with epoxy bead 29B attaching the respective panels to each other on the end opposite to where tape 29A electrically connects panels 26 and 27. Rigid-flex board 22 is connected to underlying printed circuit board 25 with standard surface mount technology such as ball grid array 25A on the exterior surface of panel 26 in FIG. 2. Ball grid array technologies use solder balls for mechanical and electrical connection to printed circuit boards. Other standard surface mount technologies that may be used in accordance with this invention to mount rigid-flex board 22 on printed circuit board 25 are solder screen print technologies. Pin grid array technologies may also be employed to connect rigid-flex board 22 to underlying printed circuit board 25. Chip 21 is surface mounted on the interior surface of bottom panel 26. To address thermal dissipation concerns, thermoconductive double-sided adhesive tape 28 may be placed on chip 21 as described in commonly assigned U.S. patent application, Ser. No. 08/574,049 which is incorporated herein by reference.

Figure 3B:
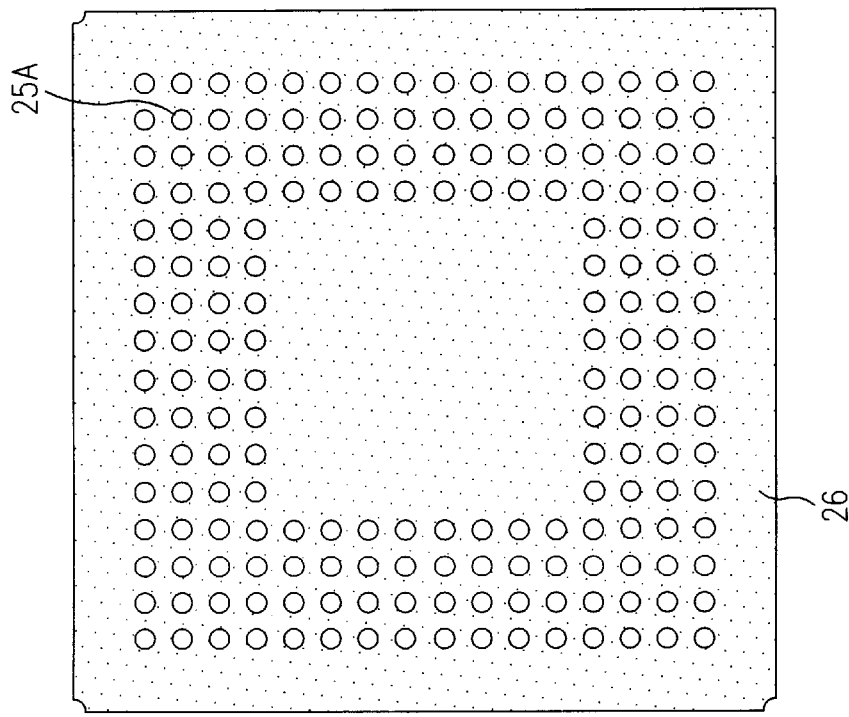
FIGS. 3A and 3B show a top and bottom view, respectively, of one embodiment of the rigid-flex board in accordance with this invention.
Figure 3A:
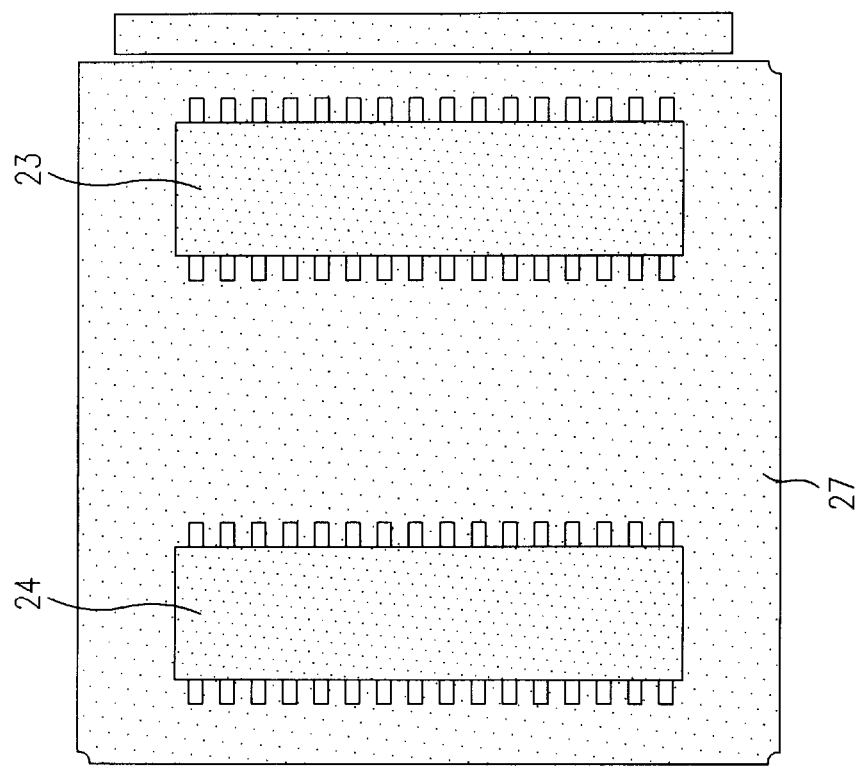
Figure 4B:
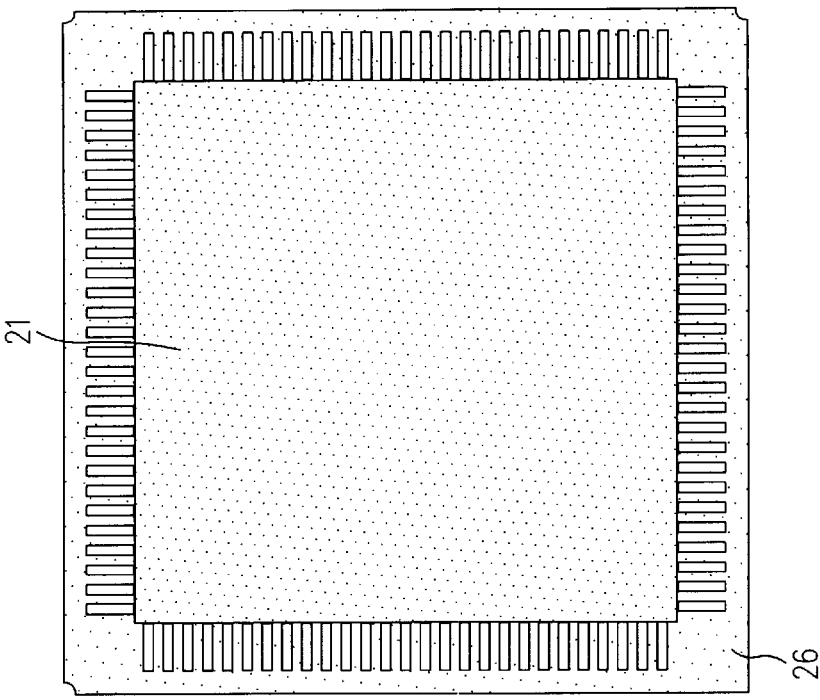
FIGS. 4A and 4B show the top and bottom interior, respectively, of the rigid-flex board in accordance with an embodiment of this invention.
Figure 4A:
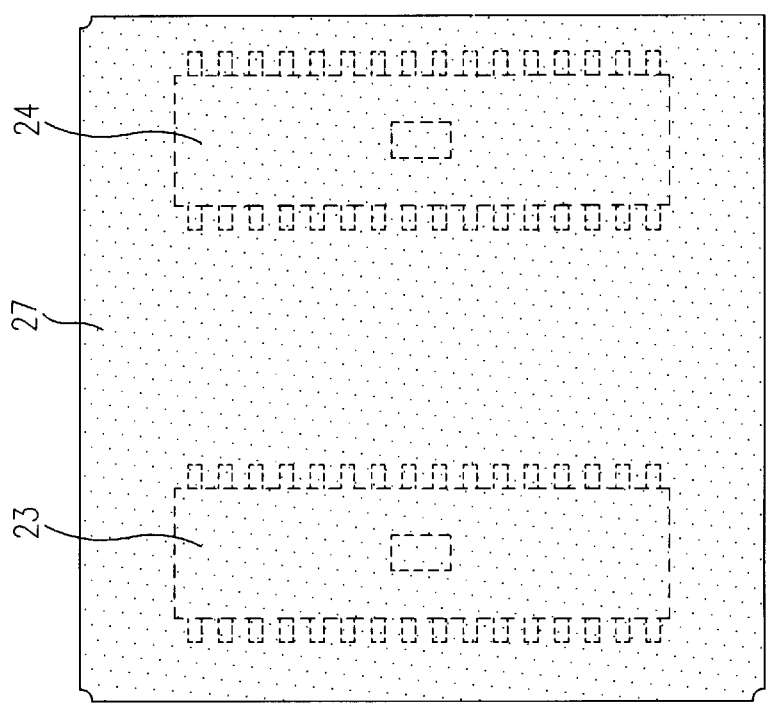

Additional packaged chips 23 and 24 are surface mounted on the exterior surface of top panel 27 and, for example, a chip may be mounted on the interior surface of panel 27 (opposite chip 21) as well. FIG. 3B shows a bottom view of panel 26 with ball grid array 25A footprint for surface mounting on corresponding bonding pads (not shown) on printed circuit board 25. FIG. 3A shows a top view of panel 27 with packaged chips 23 and 24 mounted on the top surface of panel 27. FIG. 4B shows a top view of panel 26 with packaged chip 21 mounted thereon and FIG. 4A shows a bottom view of panel 27 with the locations of packaged chips 23 and 24 shown in dashed lines on the top surface of panel 27.

Figure 5A:
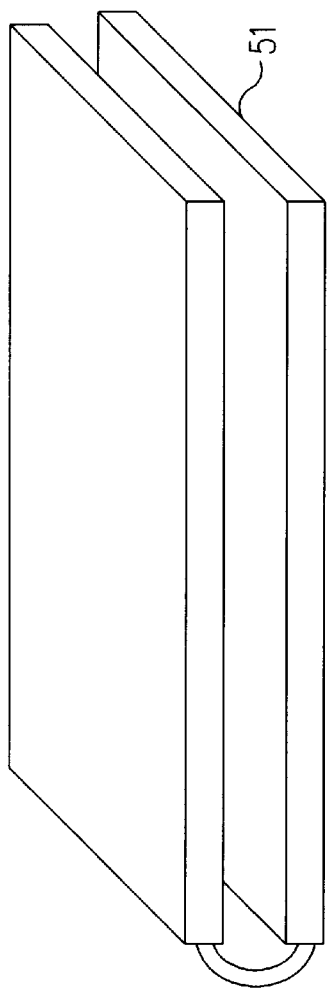
FIGS. 5A–5C show steps in a method of attaching a rigid-flex substrate to a printed circuit board in accordance with one embodiment of this invention.
Figure 5B:
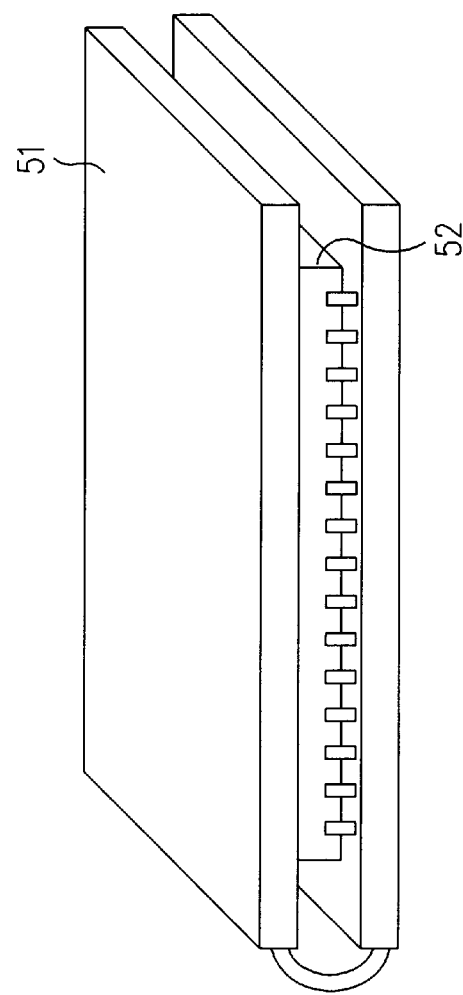
Figure 5C:
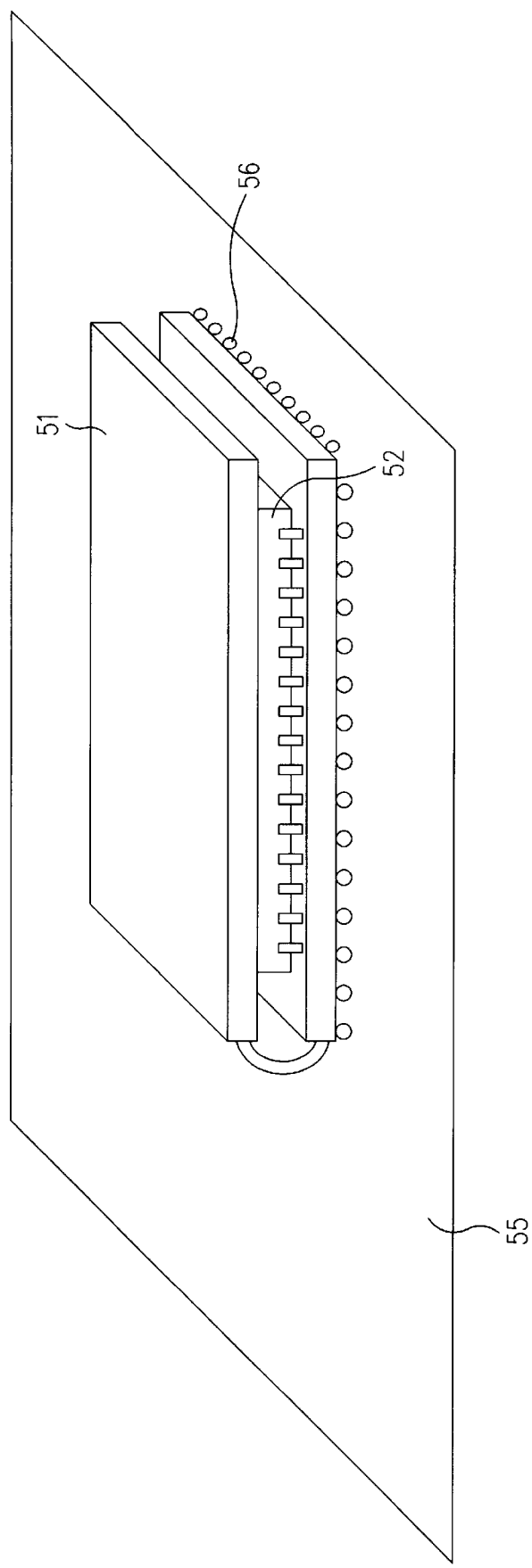

FIGS. 5A–5C show steps in a method of mounting rigid-flex substrate 51 on printed circuit board 55 in accordance with one embodiment of this invention. Specifically, rigid-flex substrate 51 with single mounted chip 52 is shown in FIG. 5C attached to printed circuit board 55 by ball grid array 56 but it is understood that there may be a plurality of components mounted on rigid-flex substrate 51 and rigid-flex substrate 51 may be attached using any surface mount technology to printed circuit board 55. An overview of FIGS. 5A–5C follows:

FIG. 5A shows rigid-flex substrate 51;

FIG. 5B shows chip 52 mounted on rigid-flex substrate 51;

FIG. 5C shows rigid-flex substrate 51 with chip 52 mounted on printed circuit board 55.

Figure 5D:
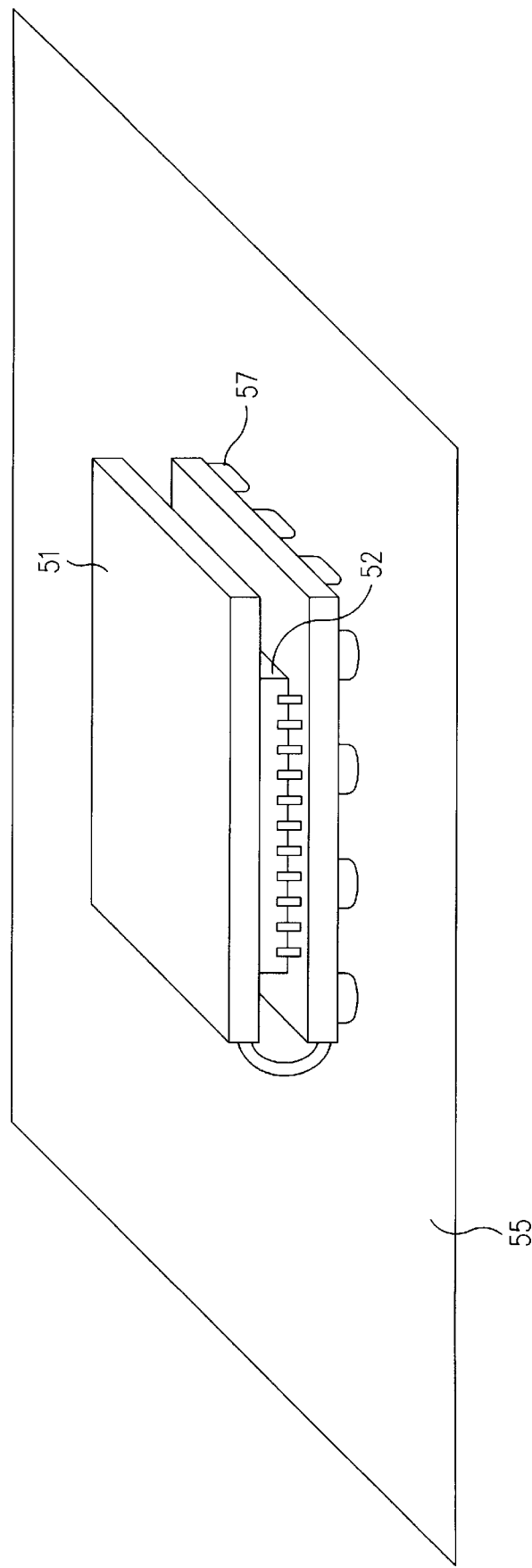
FIG. 5D shows a rigid-flex substrate, with a chip, mounted on a printed circuit board by solder screen print surface mount technology.

FIG. 5D shows an embodiment of the present invention wherein rigid-flex substrate 51, with chip 52, is mounted on printed circuit board 55 by solder screen print 57.

While a standard ball grid array package is approximately 100 mils in height, a sandwich package in accordance with this invention is from 250 mils to 350 mils in height depending on the thickness of the packages mounted on the rigid-flex board 22. However, the overall sandwich configuration has the same footprint as the ball grid array 25A (see FIG. 3B) and allows packaged components that are already burned in and tested to be mounted on rigid-flex board 22. On rigid-flex board 22 as shown in FIGS. 2, 3A, 3B, 4A, and 4B more electrical connections can be made between rigid-flex board 22 and the printed circuit board 25 than with the prior art DRAM SIMM connector style since an entire rigid-flex board panel surface is available for placement of surface mount technology connections. The increase in the number of electrical connections that can be made in accordance with this invention is on the order of the square of the connections available using the prior art DRAM SIMM style connector. This is important since the number of output leads per packaged component is increasing in today's electronics applications. Increasing the number of available electrical connections allows more electronic components to be mounted on rigid-flex board 22 (see FIG. 2).

The above described embodiments should be regarded as illustrative rather than restrictive. The invention should not be construed as being limited to the particular embodiments described. Variations can be made to the described embodiments by workers skilled in the art without departing from the scope of the present invention as defined by the following claims.

I claim:

1. A semiconductor packaging structure comprising:

a rigid-flex substrate; and at least one semiconductor package mounted on said rigid-flex substrate, said rigid-flex substrate having surface mount connections for mounting said rigid-flex substrate on a printed circuit board, wherein said surface mount connections comprise a ball grid array.

2. The semiconductor packaging structure of claim 1 wherein said semiconductor package includes an integrated circuit.

3. The semiconductor packaging structure of claim 1 further comprising a thermoconductive double-sided tape attached to a surface of said semiconductor package.

4. A semiconductor packaging structure comprising:

a rigid-flex substrate; and at least one semiconductor package mounted on said rigid-flex substrate, said rigid-flex substrate having surface mount connections for mounting said rigid-flex substrate on a printed circuit board, wherein said rigid-flex substrate is mounted on said printed circuit board using solder screen print.

5. The semiconductor packaging structure of claim 4 further comprising a thermoconductive double-sided tape attached to a surface of said semiconductor package.

6. A semiconductor packaging structure comprising a rigid-flex substrate structure having a first panel and a second panel, wherein said first panel is electrically coupled to said second panel with said first panel having conductive contacts for surface mounting said first panel on a printed circuit board, said conductive contacts comprising a solder screen print.

7. The semiconductor packaging structure of claim 6 further comprising at least one semiconductor package having a first surface and a second surface, said second surface of said semiconductor package being surface mounted on said second panel.

8. The semiconductor packaging structure of claim 6 wherein a conductive tape electrically couples said first panel to said second panel.

9. The semiconductor packaging structure of claim 8 wherein said second panel is positioned substantially parallel to said first panel in a sandwich configuration.

10. A semiconductor packaging structure comprising:

a rigid-flex substrate structure having a first panel and a second panel, wherein said first panel is electrically coupled to said second panel with said first panel having conductive contacts for surface mounting said first panel on a printed circuit board; and at least one semiconductor package having a first surface and a second surface, said second surface of said semiconductor package being surface mounted on said second panel, wherein a thermoconductive double-sided adhesive tape is attached to said first surface of said semiconductor package.

11. A semiconductor packaging structure comprising a rigid-flex substrate structure having a first panel and a second panel, wherein said first panel is electrically coupled to said second panel with said first panel having conductive contacts for surface mounting said first panel on a printed circuit board, wherein said conductive contacts comprise a ball grid array.

12. A method for mounting a rigid-flex substrate on a printed circuit board comprising:

providing said rigid-flex substrate;

mounting at least one semiconductor package on said rigid-flex substrate; and surface mounting said rigid-flex substrate on said printed circuit, wherein said surface mounting comprises using a ball grid array for mounting said rigid-flex substrate on said printed circuit board.

13. The method of claim 12 further comprising mounting a thermoconductive double-sided tape to a surface of said semiconductor package.

14. A method for mounting a rigid-flex substrate on a printed circuit board comprising:

providing said rigid-flex substrate;

mounting at least one semiconductor package on said rigid-flex substrate; and surface mounting said rigid-flex substrate on said printed circuit board using a solder screen print.

15. The method of claim 14 further comprising mounting a thermoconductive double-sided tape to a surface of said semiconductor package.

\* \* \* \* \*